United States Patent
Kim et al.

(10) Patent No.: US 7,388,410 B2
(45) Date of Patent: Jun. 17, 2008

(54) INPUT CIRCUITS CONFIGURED TO OPERATE USING A RANGE OF SUPPLY VOLTAGES

(75) Inventors: Eon-Guk Kim, Seoul (KR); Dae-Gyu Kim, Gyeonggi-do (KR); Jae-Bum Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 196 days.

(21) Appl. No.: 11/350,711

(22) Filed: Feb. 9, 2006

(65) Prior Publication Data

US 2006/0181322 A1 Aug. 17, 2006

(30) Foreign Application Priority Data

Feb. 14, 2005 (KR) .................... 10-2005-0011913

(51) Int. Cl.
*H03B 1/00* (2006.01)
*H03K 3/00* (2006.01)

(52) U.S. Cl. .............. 327/108; 327/112; 327/139; 327/334; 327/544; 327/596

(58) Field of Classification Search ............. 327/108, 327/139, 334, 544, 596, 112
See application file for complete search history.

(56) References Cited

U.S. PATENT DOCUMENTS

| | | | |
|---|---|---|---|
| 5,652,527 A * | 7/1997 | Phillips et al. | 326/83 |
| 6,091,264 A | 7/2000 | Kirsch et al. | |
| 6,724,226 B2 * | 4/2004 | Kim | 327/108 |
| 6,756,826 B1 * | 6/2004 | Klein et al. | 327/112 |

2003/0001629 A1  1/2003  Kim

FOREIGN PATENT DOCUMENTS

| | | |
|---|---|---|
| JP | 10-276081 | 10/1998 |
| KR | 1020030002501 A | 1/2003 |
| KR | 1020040065012 A | 7/2004 |

OTHER PUBLICATIONS

Search Report for Netherlands Patent Application No. 1031099; Mailed Sep. 6, 2006.

* cited by examiner

*Primary Examiner*—Charkes D. Garber
*Assistant Examiner*—John W Poos
(74) *Attorney, Agent, or Firm*—Myers Bigel Sibley & Sajovec, PA

(57) ABSTRACT

An input circuit includes an input signal transmission circuit configured to output a first transmission signal at a first output node in response to an input signal at an input node, and a Schmitt trigger inverter configured to output a second transmission signal at a second output node in response to the first transmission signal. The input signal transmission circuit includes a voltage drop element connected to the input node and configured to provide a voltage drop between the input node and a transistor having a gate to which a first supply voltage is applied. An input circuit may include an input signal transmission circuit configured to output a first transmission signal in response to an input signal and a feedback control signal, a Schmitt trigger inverter configured to output a second transmission signal in response to the first transmission signal and a second control signal, and an enable block configured to generate the feedback control signal and the second control signal in response to an enable signal.

32 Claims, 6 Drawing Sheets

INPUT CIRCUITS CONFIGURED TO OPERATE USING A RANGE OF SUPPLY VOLTAGES

CROSS-REFERENCE TO RELATED PATENT APPLICATION

This application claims priority to Korean Patent Application No. 10-2005-0011913, filed on Feb. 14, 2005, in the Korean Intellectual Property Office, the disclosure of which is hereby incorporated herein by reference as if set forth in its entirety.

FIELD OF THE INVENTION

The present invention relates to input circuits for electronic circuits, and more particularly, to input circuits configured to operate using a range of supply voltages.

BACKGROUND

Conventional electronic circuits may be driven using a single supply voltage having a ground voltage for reference. Even when two supply voltages are used, the supply voltages may typically be identical with each other except for their polarities, for example, ±5 volts and/or ±3.3 volts. Such supply voltages may also be employed in connection with circuits incorporating semiconductor devices.

For systems with very fast operating speeds and/or low current consumption, electronic circuits may use a greater variety of supply voltages and/or direct current (DC) bias voltages as compared to conventional circuits. An electronic circuit configured to operate using a range of supply voltages may include a tolerant input circuit that is designed to generate an input voltage having desired characteristics, such as voltage level, rise/fall time, noise level, and/or other characteristics, in response to a signal voltage applied to an input pad of the circuit.

FIG. 1 is a circuit diagram of a conventional input circuit 100 configured to operate using a range of supply voltages. Referring to FIG. 1, the input circuit 100 includes an electrostatic discharge (ESD) protection circuit 110, an input signal transmission circuit 120, a Schmitt trigger inverter 130, and an inverter 140.

A first supply voltage VDD1 may have a lower voltage level than a voltage level of a second supply voltage VDD0 and a third supply voltage VDDP. Further, a ground voltage GND may be 0V (volts).

The ESD protection circuit 110 discharges electrostatic charge present in an input signal applied through an input pad 105. The ESD protection circuit 110 may discharge static charge through the first supply voltage VDD0 and/or the ground voltage GND. Thus, the ESD protection circuit 110 provides the input signal applied to the input pad 105 to the input node N0 with reduced electrostatic charge. The ESD protection circuit 110 may include five MOS transistors and a resistor R configured as shown in FIG. 1. Since the structure and operation of the ESD protection circuit 110 are well known, a more detailed description of the ESD protection circuit 110 may be omitted.

The Schmitt trigger inverter 130 generates the second transmission signal at the second output node N2 in response to the first transmission signal at the first output node N1.

The input signal transmission circuit 120 generates and outputs a first transmission signal at the first output node N1 using the input signal applied at the input node N0 through the ESD protection circuit 110, in response to a second transmission signal at the second output node N2 generated at an output of the Schmitt trigger inverter 130.

The inverter 140 inverts the phase of the second transmission signal at the second output node N2 and outputs it as an output signal OUT. The inverter 140 may be used as a buffer for providing the second transmission signal at the second output node N2 to, for example, a circuit that operates based on the second transmission signal.

Each of the second supply voltage VDD0 and the third supply voltage VDDP may have a voltage of 3.3V and the first supply voltage VDD1 may have a voltage of 1V.

When a voltage of zero volts is applied to the input pad 105, the voltage level of the input signal at the input node N0 output from the ESD protection circuit 110 is also zero volts. Also, an NMOS transistor M1 having a gate to which the second supply voltage VDDP of 3.3V is applied is turned on. Consequently, the voltage level of the first transmission signal at the first output node N1 will be zero volts. The Schmitt trigger inverter 130, whose operation is controlled by the voltage of the input signal at the input node N0, may cause the second transmission signal at the second output node N2 to have a voltage level of 3.3V in response to the first transmission signal at the first output node N1 having a voltage level of zero volts. An NMOS transistor M5, which has a gate connected to the second output node N2 having a voltage level of 3.3V, is turned on, and an NMOS transistor M4 having a gate to which the first supply voltage VDD0 of 3.3V is applied is also turned on. Accordingly, since the voltage applied to the gate of a PMOS transistor M2 is zero volts, the PMOS transistor M2 is also turned on.

The NMOS transistor M1 and the PMOS transistor M2, which may form a transmission gate, may be driven through the procedures described above. When a voltage of zero volts is applied at the input node N0, a PMOS transistor M3, which has a first current terminal connected to the input node N0 and a gate to which the first supply voltage VDD1 with a voltage level of 1V is applied, remains off.

When the voltage level at the input node N0 is gradually increased to about 1.6V, the voltage between the gate and the source of the PMOS transistor M3 is −0.6V. If the threshold voltage of the MOS transistor M3 is −0.6V, current will start to flow once the voltage at the input node N0 starts to go over about 1.6V.

The second transmission signal at the second output node N2 output from the Schmitt trigger inverter 130 will change from 3.3V to 0V when the first transmission signal at the first output node N1 reaches 1.9V. However, the MOS transistors M3, M4, and M5 will remain on while the voltage applied to the input pad is increased from 1.6V to 1.9V.

Accordingly, in this voltage range, undesired leakage current may flow from the PMOS transistor M3 to the ground voltage connected to a terminal of the NMOS transistor M5. This leakage current is illustrated in the graphs on the left-hand side of FIG. 6. As shown therein, in a conventional input circuit configured to operate using a range of supply voltages, when a voltage V(PAD) of the input pad 105 is increased, a leakage current I(PAD) may flow from the input pad 105 just before and/or just after the transition of the voltage V(n2) of the second transmission signal at the second output node N2 from a high level to a low level. As the operating voltage of a system using the circuit is lowered, the difference between the voltage level of a signal input/output through the input pad and the operating voltage may increase, and the threshold voltage of MOS transistors employed in the circuit may be lowered. These changes may result in an increase in the amount of a leakage current in the circuit. Increased leakage currents may result in higher power consumption and/or shorter battery life.

SUMMARY

An input circuit according to some embodiments of the invention includes an input signal transmission circuit configured to output a first transmission signal at a first output node in response to an input signal at an input node, and a Schmitt trigger inverter having an input connected to the first output node and an output connected to a second output node and configured to output a second transmission signal at the second output node in response to the input signal and the first transmission signal. The input signal transmission circuit may include a voltage drop element having a first terminal connected to the input node and having a second terminal and being configured to provide a voltage drop between the first terminal thereof and the second terminal thereof, a first MOS transistor having a first current terminal connected to the second terminal of the voltage drop element and a gate to which a first supply voltage may be applied, a second MOS transistor having a first current terminal connected to a second current terminal of the first MOS transistor at a common node and a gate to which a second supply voltage may be applied, a third MOS transistor having a first current terminal connected to a second current terminal of the second MOS transistor, a second current terminal connected to a ground voltage and a gate to which the second transmission signal may be applied, and a switch having an input connected to the input node and an output connected to the first output node and configured to transmit the input signal to the first output node in response to a voltage at a common terminal of the first and second MOS transistors and a third supply voltage that is different from the first supply voltage.

The voltage drop element may include a fourth MOS transistor having a first current terminal connected to the input node, a second current terminal coupled to the first current terminal of the first MOS transistor, and a gate connected to the first current terminal of the first MOS transistor.

The voltage drop element may include a diode having an anode connected to the input node and a cathode connected to the first current terminal of the first MOS transistor.

The switch may include a fifth MOS transistor having a first current terminal connected to the input node, a second current terminal connected to the first output node and a gate to which the third supply voltage may be applied, and a sixth MOS transistor having a first current terminal to which the first current terminal of the fifth MOS transistor may be connected, a second current terminal to which the second current terminal of the fifth MOS transistor may be connected, and a gate connected to the common node of the first and second MOS transistors.

The second MOS transistor, the third MOS transistor and the fifth MOS transistor may be NMOS transistors, and the first MOS transistor and the sixth MOS transistor may be PMOS transistors.

A bulk region of each of the first MOS transistor and the sixth MOS transistor may be allowed to float or may be biased at a predetermined voltage. The predetermined voltage may be the highest supply voltage used in a system in which the input circuit may be used.

A voltage level of the second supply voltage and a voltage level of the third supply voltage may be both higher than a voltage level of the first supply voltage.

The Schmitt trigger inverter may include a seventh MOS transistor having a first current terminal connected to the third supply voltage and a gate to which the input signal may be applied, an eighth MOS transistor having a first current terminal connected to a second current terminal of the seventh MOS transistor and a gate to which the first transmission signal may be applied, a ninth MOS transistor having a first current terminal connected to a second current terminal of the eighth MOS transistor, a second current terminal through which the second transmission signal may be output, and a gate to which the first transmission signal may be applied, a tenth MOS transistor having a first current terminal connected to the commonly connected terminals of the eighth and ninth MOS transistors, a second current terminal connected to the ground voltage, and a gate to which the second transmission signal may be applied, an eleventh MOS transistor having a first current terminal through which the second transmission signal may be output and a gate to which the first transmission signal may be applied, a twelfth MOS transistor having a first current terminal connected to a second current terminal of the eleventh MOS transistor and a gate to which the first transmission signal may be applied, a thirteenth MOS transistor having a first current terminal connected to a second current terminal of the twelfth MOS transistor, a second current terminal connected to the ground voltage, and a gate to which the input signal may be applied, and a fourteenth MOS transistor having a first current terminal connected to the commonly connected terminals of the eleventh and twelfth MOS transistors, a second current terminal connected to the third supply voltage, and a gate to which the second transmission signal may be applied.

The seventh, eighth, ninth and tenth MOS transistors may be PMOS transistors and the eleventh, twelfth, thirteenth and fourteenth MOS transistors may be NMOS transistors.

A bulk region of each of the seventh, eighth, ninth and tenth MOS transistors may be commonly biased to the second supply voltage and a bulk of each of the eleventh, twelfth, thirteenth and fourteenth MOS transistors may be commonly biased to the ground voltage.

The input circuit may further include an electrostatic discharge (ESD) protection circuit disposed between an input pad and the input signal transmission circuit. The ESD protection circuit may be configured to discharge electrostatic charge that may be applied through the input pad.

The input circuit may further include an inverter configured to buffer the second transmission signal generated by the Schmitt trigger inverter.

An input circuit according to further embodiments of the invention includes an input signal transmission circuit configured to output a first transmission signal at a first output node in response to an input signal at an input node and a feedback control signal at a feedback control node, a Schmitt trigger inverter configured to output a second transmission signal at a second output node in response to the first transmission signal and a second control signal, and an enable block configured to generate the feedback control signal in response to an enable signal.

The input signal transmission circuit may include a voltage drop element having a first terminal connected to the input node and a second terminal, a first MOS transistor having a first current terminal connected to the second of the voltage drop element and a gate to which a first supply voltage may be applied, a second MOS transistor having a first current terminal connected to a second current terminal of the first MOS transistor at a common node and a gate to which a second supply voltage may be applied, a third MOS transistor having a first current terminal connected to a second current terminal of the second MOS transistor, a second current terminal connected to a ground voltage, and a gate to which the feedback control signal may be applied, and a switch having a first terminal connected to the input node and a second terminal connected to the first output node and configured to transmit the input signal to the first output node in response to a voltage at the common terminal of the first and second MOS transistors and a third supply voltage.

The voltage drop element may include a fourth MOS transistor having a first current terminal connected to the input node, a second current terminal coupled to the first current terminal of the first MOS transistor, and a gate connected to the first current terminal of the first MOS transistor.

The voltage drop element may include a diode having an anode connected to the input node and a cathode connected to the first current terminal of the first MOS transistor.

The first switch may include a fifth MOS transistor having a first current terminal connected to the input node, a second current terminal connected to the first output node, and a gate to which the third supply voltage may be applied, and a sixth MOS transistor having a first current terminal to which the first current terminal of the fifth MOS transistor may be connected, a second current terminal to which the second current terminal of the fifth MOS transistor may be connected, and a gate connected to the common node of the first and second MOS transistors.

The second MOS transistor, the third MOS transistor, and the fifth MOS transistor may be NMOS transistors, and the first MOS transistor and the sixth MOS transistor may be PMOS transistors.

A bulk region of each of the first MOS transistor and the sixth MOS transistor may be floated or may be biased at a predetermined voltage. The predetermined voltage may be the highest supply voltage used in a system in which the input circuit may be used.

A voltage level of the second supply voltage and a voltage level of the third supply voltage may be both higher than a voltage level of the first supply voltage.

The Schmitt trigger inverter may include a seventh MOS transistor having a first current terminal connected to the third supply voltage and a gate to which the input signal may be applied, an eighth MOS transistor having a first current terminal connected to a second current terminal of the seventh MOS transistor and a gate to which the first transmission signal may be applied, a ninth MOS transistor having a first current terminal connected to a second current terminal of the eighth MOS transistor, a second current terminal through which the second transmission signal may be output, and a gate to which the first transmission signal may be applied, a tenth MOS transistor having a first current terminal connected to the commonly connected terminals of the eighth and ninth MOS transistors, a second current terminal connected to the ground voltage, and a gate to which the second transmission signal may be applied, an eleventh MOS transistor having a first current terminal which may be connected to the second current terminal of the ninth MOS transistor and through which the second transmission signal may be output, and a gate to which the first transmission signal may be applied, a twelfth MOS transistor having a first current terminal connected to a second current terminal of the eleventh MOS transistor and a gate to which the first transmission signal may be applied, a thirteenth MOS transistor having a first current terminal connected to a second current terminal of the twelfth MOS transistor, a second current terminal to which the ground voltage may be applied, and a gate to which the enable signal may be applied, and a fourteenth MOS transistor having a first current terminal connected to a common terminal of the eleventh and twelfth MOS transistors, a second current terminal to which the third supply voltage may be applied, and a gate to which the second transmission terminal signal may be applied.

The seventh, eight, ninth and tenth MOS transistors may be PMOS transistors and the eleventh, twelfth, thirteenth and fourteenth MOS transistors may be NMOS transistors.

A bulk region of each of the seventh, eight, ninth and tenth MOS transistors may be biased to the second supply voltage and a bulk region of each of the eleventh, twelfth, thirteenth and fourteenth MOS transistors may be commonly biased to the ground voltage.

The enable block may include a pull-up unit having a first current terminal connected to the second output node and a second current terminal connected to the third supply voltage and configured to apply the third supply voltage to the second output node in response to the enable signal, an inverter configured to invert the enable signal and to output the inverted enable signal, and a switch having a first terminal connected to the second output node and a second terminal connected to the feedback control node and configured to output the feedback control signal at the feedback control node by switching the second transmission signal at the second output node in response to the enable signal and the inverted enable signal.

The switch may include a first MOS transistor having first and second terminals and a gate to which the enable signal may be applied and configured to receive the second transmission signal through its first current terminal and output the feedback control signal through its second current terminal, and an second MOS transistor which has a first terminal connected to the first current terminal of the first MOS transistor, a second terminal connected to the second current terminal of the first MOS transistor, and a gate to which the inverted enable signal may be applied.

The pull-up unit may include a fifteenth MOS transistor having a first current terminal to which the second transmission signal may be applied, a second current terminal to which the third supply voltage may be applied, and a gate to which the enable signal may be applied.

The enable block may further include a pull-down unit which has a first current terminal connected to the feedback control signal, a second current terminal connected to the ground voltage, and a control terminal connected to an output of the inverter, and which is configured to pull down a voltage level of the feedback control signal to the ground voltage in response to the inverted enable signal.

The pull-down unit may include a sixteenth MOS transistor having a first current terminal connected to the feedback control signal, a second current terminal connected to the ground voltage, and a gate to which the inverted enable signal may be applied.

The input circuit may further include an ESD protection circuit disposed between an input pad and the input signal transmission circuit. The ESD protection circuit may discharge electrostatic charge that may be applied through the input pad.

The input circuit may further include an inverter configured to buffer the second transmission signal generated by the Schmitt trigger inverter.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood by those having skill in the art that as used herein, the term "MOS transistor" refers to any insulated gate field effect transistor, the gate of which comprises a metal and/or a nonmetal (such as polysilicon) and the insulator of which comprises oxide and/or other insulators (such as high dielectric constant insulators).

Figure 1:
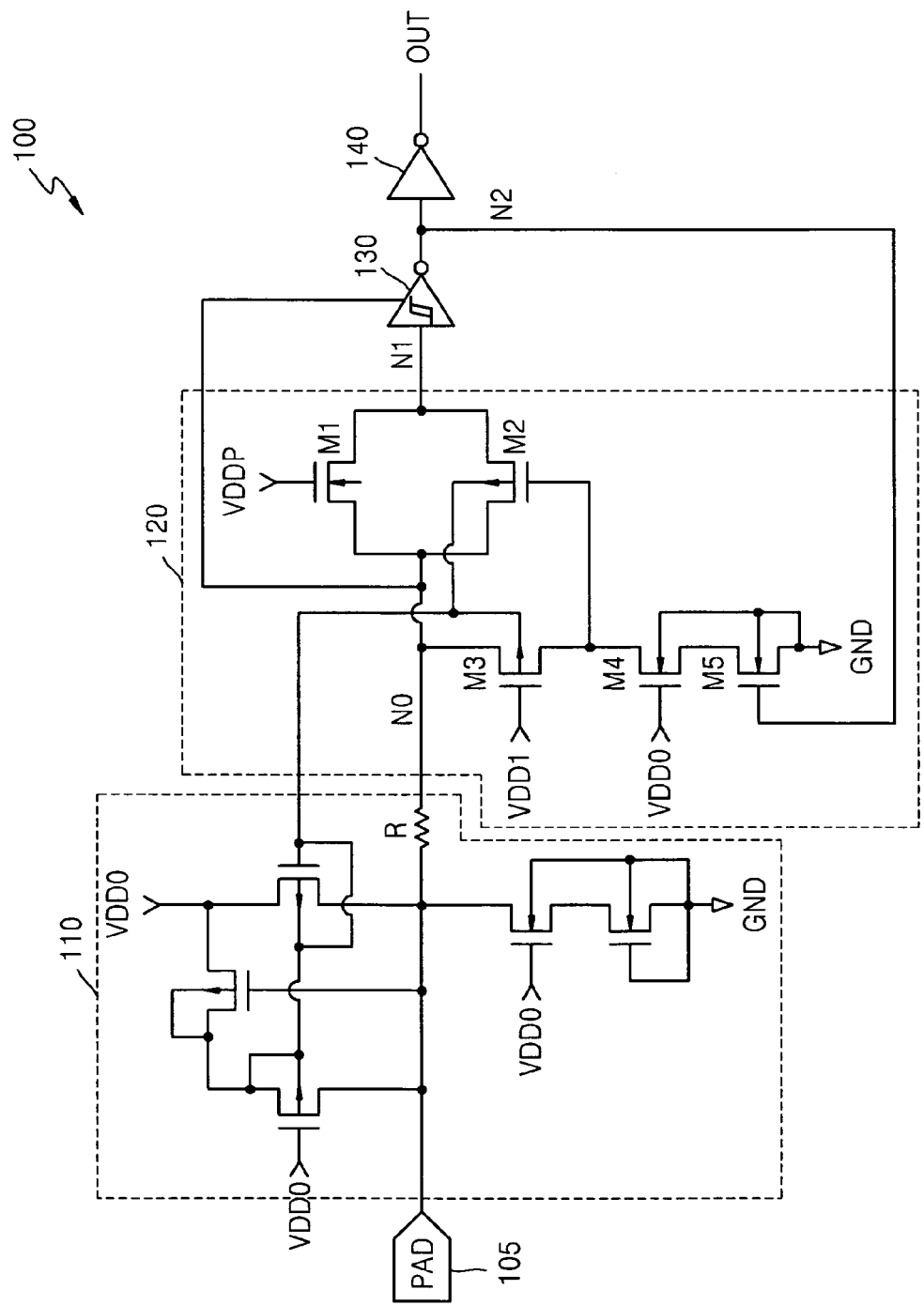
FIG. 1 is a circuit diagram of a conventional input circuit configured to operate using a range of supply voltages.
Figure 2:
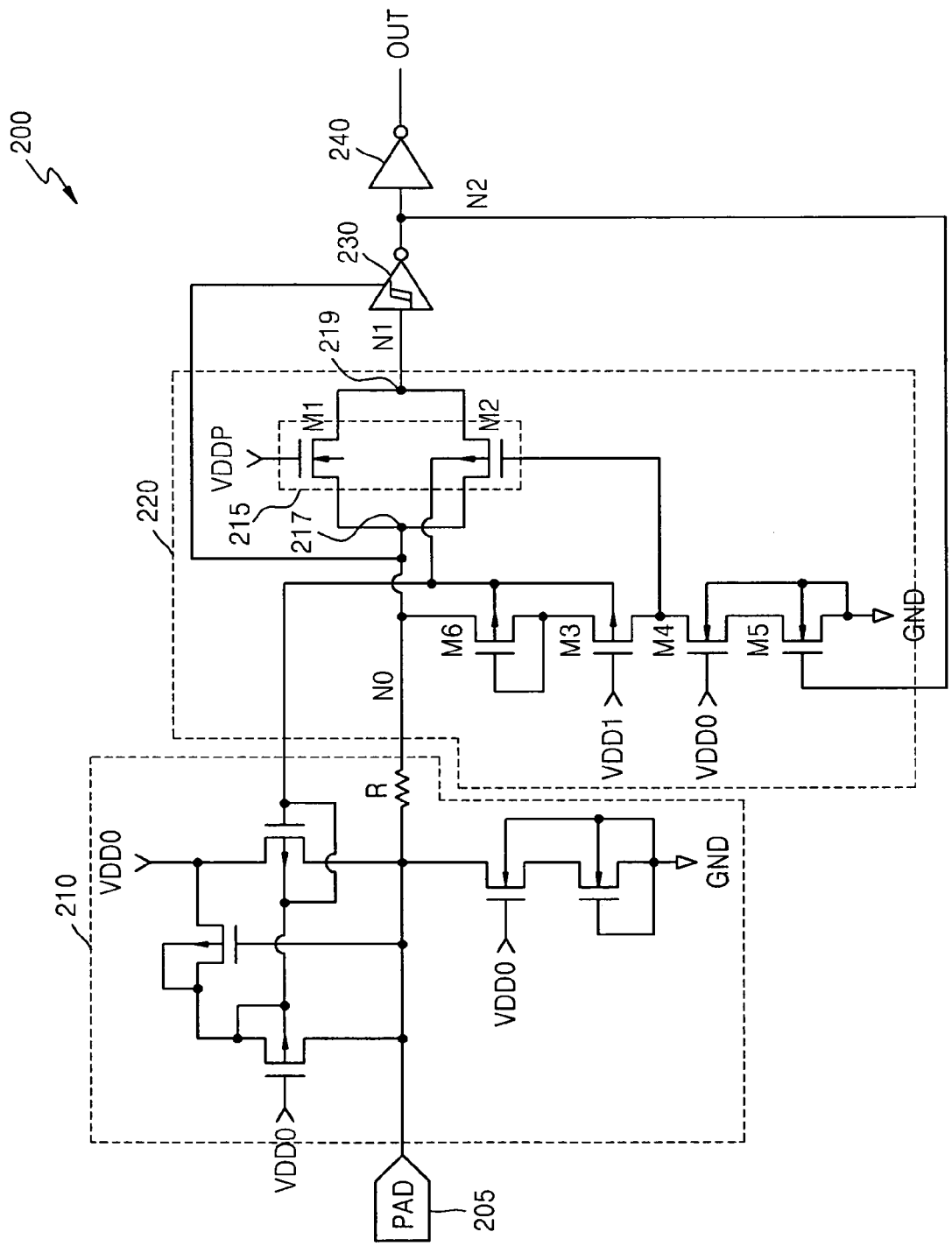
FIG. 2 is a circuit diagram of an input circuit configured to operate using a range of supply voltages according to some embodiments of the present invention.

FIG. 2 illustrates an input circuit 200 configured to operate using a range of supply voltages according to some embodiments of the present invention. Referring to FIG. 2, the input circuit 200 includes an electrostatic discharge (ESD) protection circuit 210, an input signal transmission circuit 220, a Schmitt trigger inverter 230, and an inverter 240.

The ESD protection circuit 210 may discharge electrostatic charge included in an input signal applied through an input pad 205, through a second supply voltage VDD0 and/or a ground voltage GND. Thus, the ESD protection circuit 210 may provide the input signal applied to the input pad 205 to the input node N0 with reduced electrostatic charge. The ESD protection circuit 210 may include five MOS transistors and a resistor R configured as shown in FIG. 2. Since the structure and operation of the ESD protection circuit 210 are well known, a detailed description thereof may be omitted.

The input signal transmission circuit 220 generates a first transmission signal at a first output node N1 in response to an input signal at node N0 corresponding to an input signal applied at the input pad 205.

The input signal transmission circuit 220 may include four MOS transistors M3, M4, M5, and M6 and a switch 215. In the embodiments illustrated in FIG. 2, the switch 215 is a transmission gate, but any suitable voltage-controlled switch may be used.

The MOS transistor M6 has a first current terminal connected to the input node N0. The MOS transistor M3 has a first current terminal connected both to the gate and to the second current terminal of the MOS transistor M6, and a gate to which a first supply voltage VDD1 is applied. The MOS transistor M4 has a first current terminal connected to a second current terminal of the MOS transistor M3, and a gate to which a second supply voltage VDD0 is applied. The MOS transistor M5 has a first current terminal connected to a second current terminal of the MOS transistor M4, a second current terminal connected to the ground voltage GND, and a gate connected to the second output node N2.

The switch 215, which in the illustrated embodiments includes MOS transistors M1 and M2, transmits an input signal at the input node N0, which is connected to a first terminal 217 of the switch 215, to the Schmitt trigger inverter 230 connected to a second terminal 219 of the switch 215, in response to a voltage level of a common terminal of the MOS transistors M3 and M4 and a third supply voltage VDDP.

The MOS transistor M1 has a first current terminal connected to the input node N0, a second current terminal connected at the first output node N1 to an input terminal of the Schmitt trigger inverter 230, and a gate to which the third supply voltage VDDP is applied. The MOS transistor M2 has a first current terminal connected to the first current terminal of the MOS transistor M1, a second current terminal connected to the second current terminal of the MOS transistor M1, and a gate to which the voltage of the common terminal of the MOS transistors M3 and M4 is applied.

Figure 4:
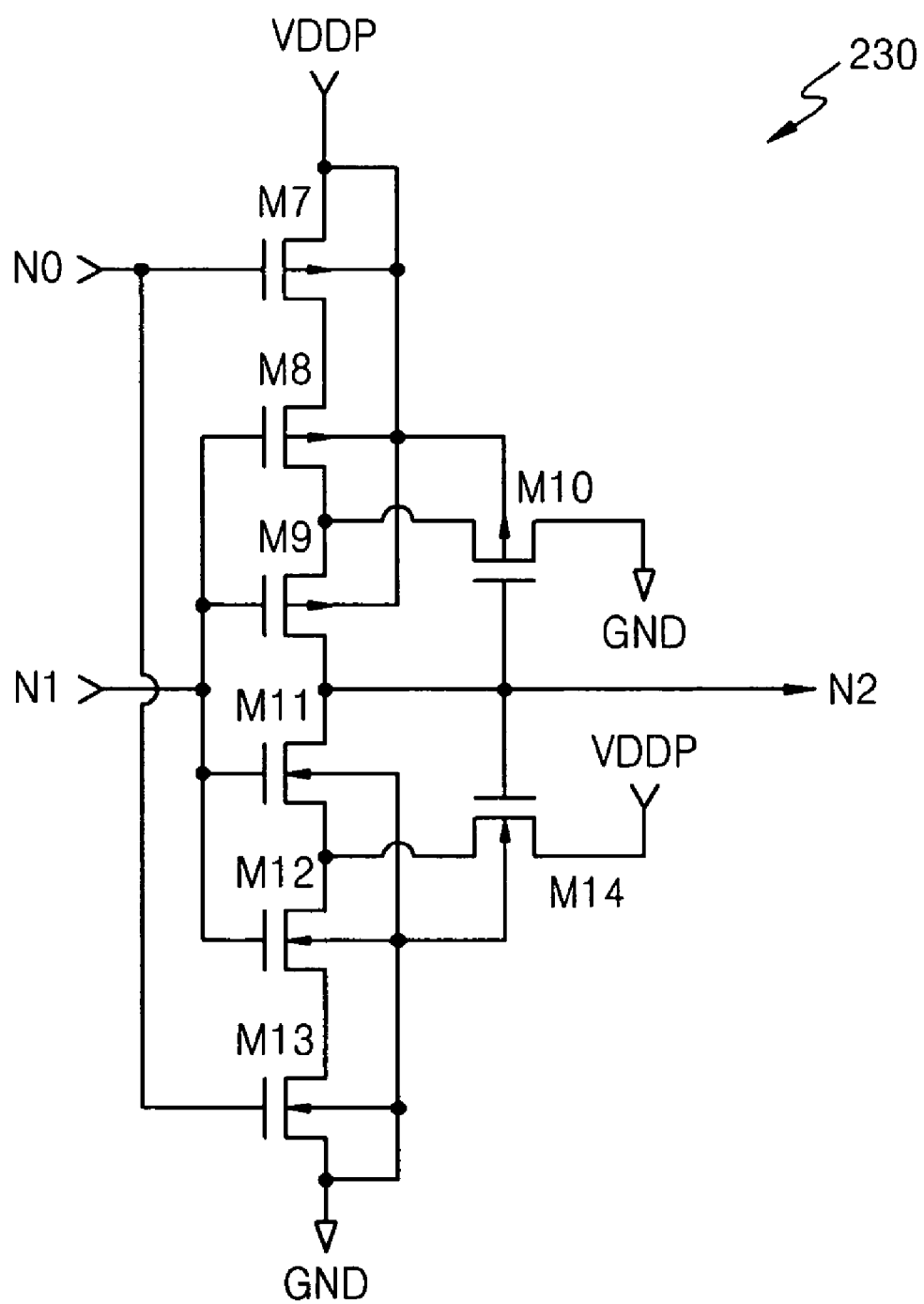
FIG. 4 is an internal circuit diagram of a Schmitt trigger inverter illustrated in FIG. 2 according to some embodiments of the present invention.

The Schmitt trigger inverter 230 generates the second transmission signal at the second output node N2 in response to the input signal at the input node N0 and the first transmission signal at the first output node N1. A circuit diagram of a Schmitt trigger inverter 230 according to some embodiments of the invention is shown in FIG. 4.

The inverter 240 may buffer the second transmission signal at the second output node N2 for providing the second transmission signal, for example, to a downstream circuit (not shown) that operates based on the second transmission signal.

In some embodiments of the invention, the MOS transistors M1, M4, and M5 may be NMOS transistors, and the MOS transistors M2, M3, and M6 may be PMOS transistors.

Further, each of the MOS transistors M2, M3, and M6 may be formed in an N-type well, which may be electrically floating and/or may be biased to the supply voltage having the highest voltage level used in the system including the input circuit 200. Consequently, bulk regions of the MOS transistors M2, M3, and M6 may be left floating and/or may be biased at a predetermined voltage level.

The second supply voltage VDD0 and the third supply voltage VDDP may have voltage levels higher than the voltage level of the first supply voltage VDD1.

An input circuit 200 configured to operate using a range of supply voltages according to some embodiments of the present invention may include a voltage drop element configured to provide a voltage drop between the input node N0 and the MOS transistor M3. For example, the voltage drop element may include a diode having a first terminal coupled to the input node N0 and a second terminal coupled to the MOS transistor M3. For example, in the embodiments illustrated in FIG. 2, the voltage drop element is provided as a PMOS transistor M6 that is configured as a diode. Because the MOS transistor M6 is provided between the input node N0 and the MOS transistor M3, the MOS transistor M3 may not turn on until a voltage that is 2Vth more than the first supply voltage VDD1 (i.e., VDD1+2Vth) is applied to the input pad 205. Assuming that a threshold voltage (Vth) of the MOS transistors M6 and M3 is about 0.6V, a voltage of about 2.2V may be applied to the input pad 205 in order to cause the third MOS transistor M3 to turn on when the first supply voltage VDD1 is 1V.

As the voltage applied at the input pad 205 is raised from 0V to 1.9V, the second transmission signal output at the second output node N2 by the Schmitt trigger inverter 230 has a first predetermined voltage level. The voltage level of the second transmission signal output at the second output node N2 from the Schmitt trigger inverter 230 may change when the voltage at the input node N0 exceeds a predetermined threshold value, which may be 1.9V in some embodiments. Therefore, even if the voltage at the input node N0 is between 1.6V and 1.9V, the MOS transistor M3 may not turn on. Thus, a potential path for leakage current which may occur in a conventional input circuit configured to operate using a range of supply voltages may not be generated in an input circuit 200 according to some embodiments of the invention.

Figure 3:
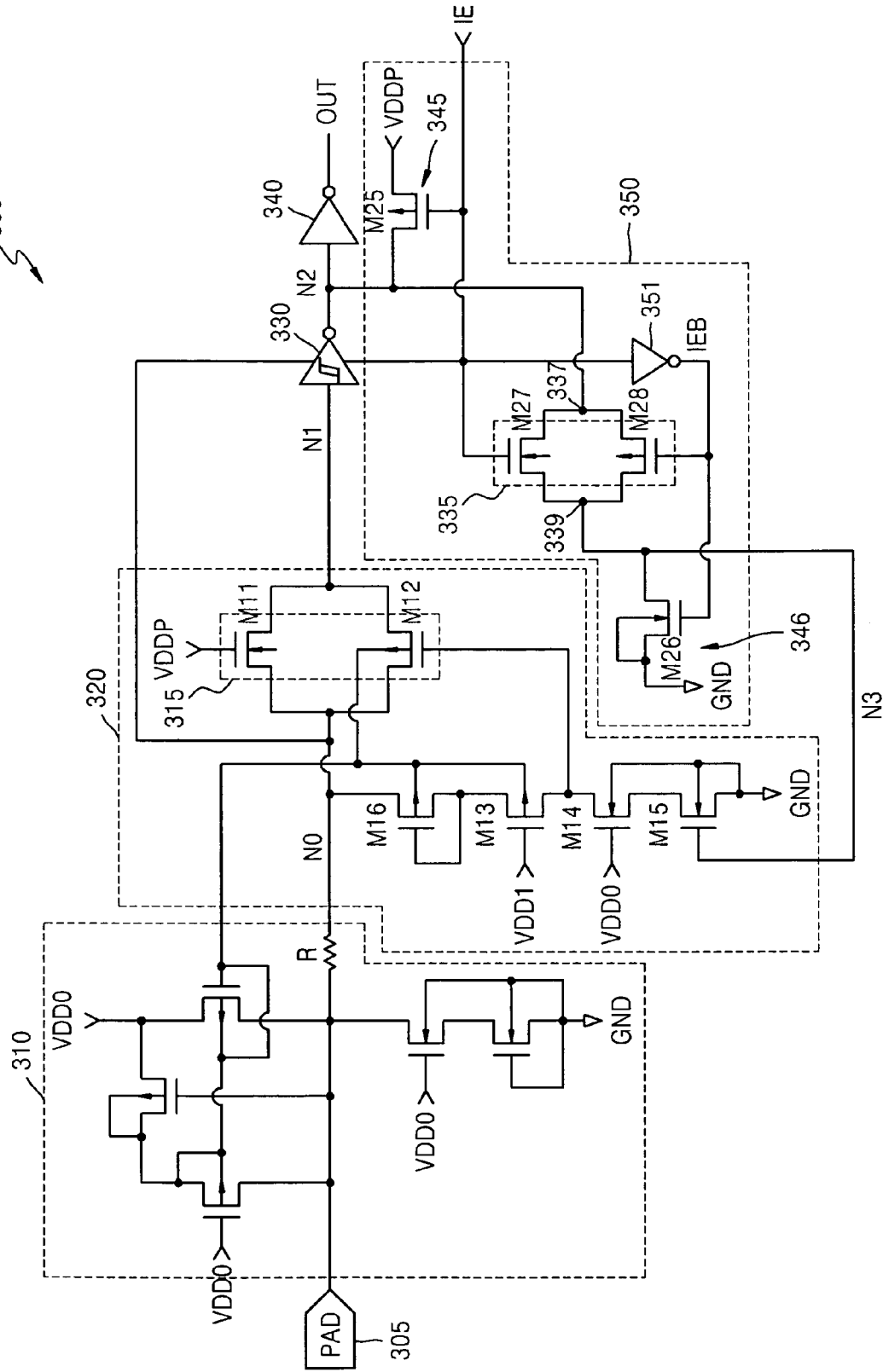
FIG. 3 is a circuit diagram of an input circuit configured to operate using a range of supply voltages according to further embodiments of the present invention.

FIG. 3 is a circuit diagram of an input circuit 300 configured to operate using a range of supply voltages according to further embodiments of the present invention.

Referring to the embodiments of FIG. 3, the input circuit 300 may include an ESD protection circuit 310, an input signal transmission circuit 320, a Schmitt trigger inverter 330, a first inverter 340 and an enable block 350.

The input signal transmission circuit 320 generates a first transmission signal at the first output node N1 in response to an input signal at an input node N0 and a feedback control signal at a feedback control node N3. The input signal transmission circuit 320 includes four MOS transistors M13, M14, M15, and M16 and a first switch 315.

The MOS transistor M16 has a first current terminal connected to the input node N0 and a gate connected to a second current terminal thereof. The MOS transistor M13 has a first current terminal connected to both the second current terminal and the gate of the MOS transistor M16, and a gate to which a first supply voltage VDD1 is applied. The MOS transistor M14 has a first current terminal connected to a second current terminal of the MOS transistor M13 and a gate connected to a second supply voltage VDD0. The MOS transistor M15 has a first current terminal connected to a second current terminal of the MOS transistor M14, a second current terminal connected to the ground voltage GND, and a gate connected to the feedback control node N3.

The first switch 315 transmits the input signal at node N0 to the Schmitt trigger inverter 330 in response to a voltage level at a common terminal of the MOS transistors M13 and M14 and the third supply voltage VDDP.

In particular, the first switch 315 may include a MOS transistor M11 and a MOS transistor M12. The MOS transistor M11 has a first current terminal connected to the input node N0, a second current terminal connected at the first output node N1 to an input terminal of the Schmitt trigger inverter 330, and a gate to which a third supply voltage VDDP is applied. The MOS transistor M12 has a first current terminal connected to the first current terminal of the MOS transistor M11, a second current terminal connected to the second current terminal of the MOS transistor M11, and a gate to which a voltage of the common terminal of the MOS transistors M13 and M14 is applied.

In some embodiments of the invention, the MOS transistors M11, M14, and M15 may be NMOS transistors, and the MOS transistors M12, M13, and M16 may be PMOS transistors.

The bulk regions of the MOS transistors M12 and M13 may be left floating and/or may be coupled to a supply voltage having the highest voltage level among the supply voltages used in the system in which the input circuit is used.

The second supply voltage VDD0 and the third supply voltage VDDP may have higher voltage levels than the first supply voltage VDD1.

Figure 5:
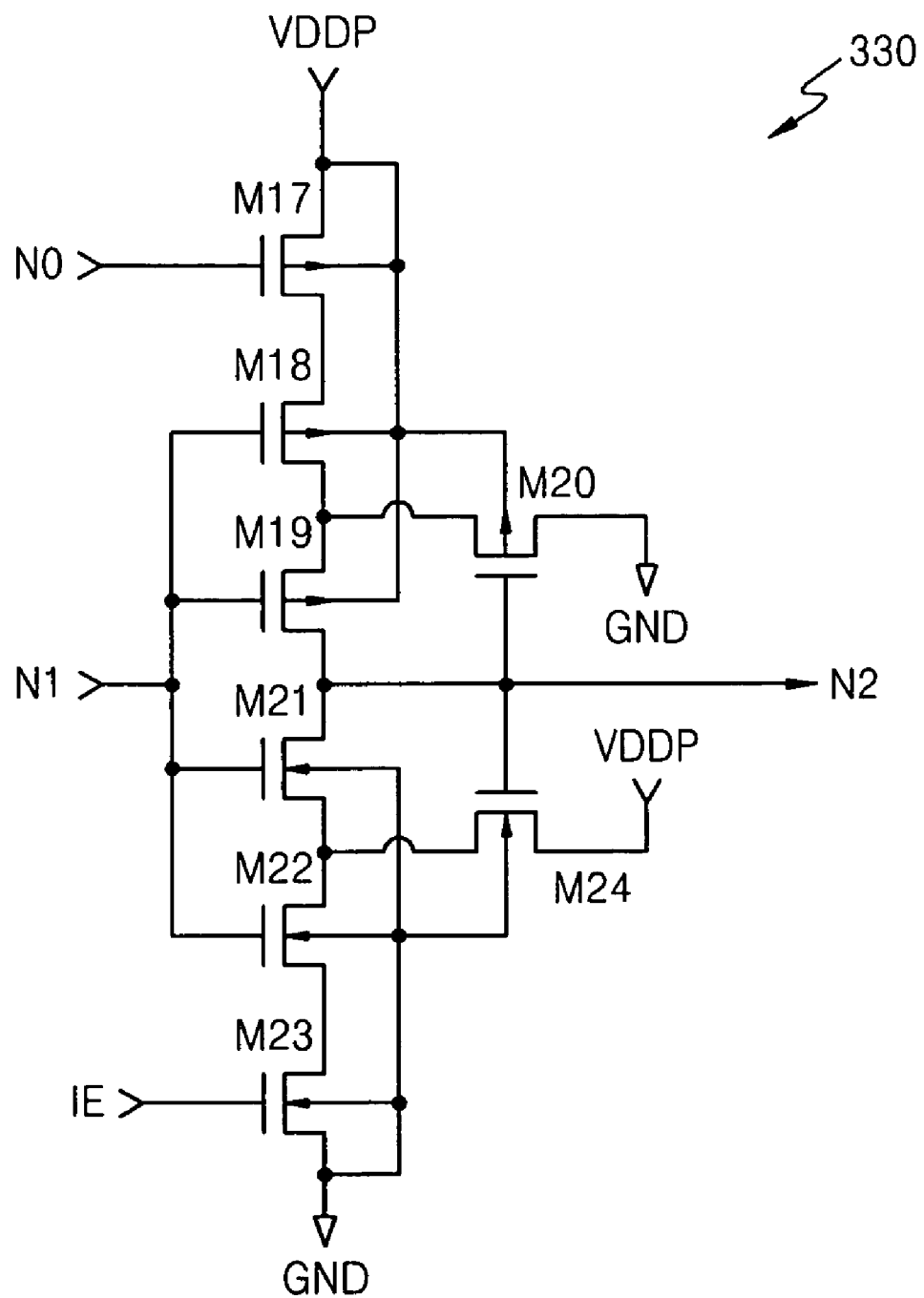
FIG. 5 is an internal circuit diagram of a Schmitt trigger inverter illustrated in FIG. 3 according to some embodiments of the present invention.

The Schmitt trigger inverter 330 generates a second transmission signal at the second output node N2 in response to the first transmission signal at the first output node N1, the input signal at the input node N0, and an enable signal IE. A circuit diagram for a Schmitt trigger inverter 330 according to some embodiments of the invention is illustrated in FIG. 5.

The enable block 350 outputs a feedback control signal at the feedback control node N3 in response to the enable signal IE and the second transmission signal at the second output node N2, and includes a second switch 335, a second inverter 351, a pull-up unit 345, and a pull-down unit 346.

The second switch 335 includes first and second terminals 337, 339. The second switch 335 transmits the feedback control signal to the input signal transmission circuit 320. In particular, the second terminal 339 of the switch 335 is connected at the feedback control node N3 to the input signal transmission circuit 320. The switch 320 is configured to switch the second transmission signal at the second output node N2 to the feedback control node N3 in response to the enable signal IE and an inverted enable signal IEB.

The second switch 335 may include MOS transistors M27 and M28 configured as shown in FIG. 3. In particular, the MOS transistor M27 receives the second transmission signal from the second output node N2 through its first current terminal, and outputs the feedback control signal at the feedback control node N3 through its second current terminal in response to an enable signal IE applied to the gate of the MOS transistor M27. The MOS transistor M28 has a first current terminal connected to the first current terminal of the MOS transistor M27, a second current terminal connected to the second current terminal of the MOS transistor M27, and a gate to which the inverted enable signal IEB, which is an output signal of the second inverter 351, is applied.

The pull-up unit 345 includes a MOS transistor M25 having a first current terminal connected to the second output node N2 and a second current terminal connected to the third supply voltage VDDP. The pull-up unit 345 raises the second transmission signal at the second output node N2 to the same level as the third supply voltage VDDP in response to the enable signal IE being applied to a gate of the pull-up MOS transistor M25.

The pull-down unit 346 includes a MOS transistor M26 having a first current terminal connected to the feedback control node N3 and a second current terminal connected to a ground voltage GND. The pull-down unit 346 brings the feedback control signal at the feedback control node N3 to the same level as the ground voltage GND in response to the inverted enable signal IEB being applied to a gate of the pull-down MOS transistor M26.

The second inverter 351 inverts the enable signal IE to provide an inverted signal IEB.

The first inverter 340 buffers the second transmission signal at the second output node N2 and outputs it as an output signal OUT.

By including the enable block 350, the input circuit 300 of FIG. 3 may reduce and/or prevent a leakage current from occurring, even when a high impedance signal is applied to the input pad 305.

For example, if the input circuit 300 is enabled when the enable signal IE is logic high ("1"), the pull-up unit 345 and the pull-down unit 346 may respectively cause the second transmission signal at the second output node N2 and the feedback control signal at the feedback control node N3 to have predetermined voltage levels, thereby resulting in the input circuit 300 being disabled.

FIG. 4 is an internal circuit diagram of the Schmitt trigger inverter 230 illustrated in FIG. 2, according to some embodiments of the invention.

Referring to FIG. 4, a Schmitt trigger inverter 230 may include eight MOS transistors M7 through M14.

The MOS transistor M7 has a first current terminal connected to the third supply voltage VDDP and a gate connected to the input node N0.

The MOS transistor M8 has a first current terminal connected to a second current terminal of the MOS transistor M7 and a gate to which the first transmission signal at the first output node N1 is applied.

The MOS transistor M9 has a first current terminal connected to a second current terminal of the MOS terminal M8, a second current terminal through which the second transmission signal is output at the second output node N2, and a gate to which the first transmission signal at the first output node N1 is applied.

The MOS transistor M10 has a first current terminal connected to a common terminal of the MOS transistors M8 and M9, a second current terminal connected to a ground voltage GND, and a gate to which the second transmission signal at the second output node N2 is applied.

The MOS transistor M11 outputs the second transmission signal at the second output node N2 through its first current terminal, and includes a gate at which the first transmission signal at the first output node N1 is applied.

The MOS transistor M12 has a first current terminal connected to a second current terminal of the MOS transistor M11 and a gate to which the first transmission signal at the first output node N1 is applied.

The MOS transistor M13 has a first current terminal connected to a second current terminal of the MOS terminal M12, a second current terminal connected to the ground voltage GND, and a gate to which the input signal at node N0 is applied.

The fourteenth MOS transistor M14 has a first current terminal connected to a common terminal of the MOS transistors M11 and M12, a second current terminal connected to the second supply voltage VDDP, and a gate to which the second transmission signal N2 is applied.

The MOS transistors M7-M10 may be PMOS transistors, and the bulk regions of each of the MOS transistors M7-M10 may be biased to the third supply voltage VDDP. The MOS transistors M11-M14 may be NMOS transistors, and the bulk regions of each MOS transistors M11-M14 may be biased to the ground voltage GND.

FIG. 5 is an internal circuit diagram of the Schmitt trigger inverter 330 illustrated in FIG. 3.

Referring to FIG. 5, the Schmitt trigger inverter 330 may include eight MOS transistors M17-M24.

The MOS transistor M17 has a first current terminal connected to the third supply voltage VDDP and a gate to which the input signal at node N0 is applied.

The MOS transistor M18 has a first current terminal connected to a second current terminal of the MOS transistor M17 and a gate to which the first transmission signal at the first output node N1 is applied.

The MOS transistor M19 has a first current terminal connected to a second current terminal of the MOS transistor M18, a second current terminal through which the second transmission signal is output at the second output node N2, and a gate to which the first transmission signal at the first output node N1 is applied.

The MOS transistor M20 has a first current terminal connected to a common terminal of the MOS transistors M18 and M19, a second current terminal connected to a ground voltage GND, and a gate to which the second transmission signal at the second output node N2 is applied.

The MOS transistor M21 has a first current terminal connected to the second current terminal of the MOS terminal M19 and through which the second transmission signal is output at the second output node N2, and a gate to which the first transmission signal at the first output node N1 is applied.

The MOS transistor M22 has a first current terminal connected to a second current terminal of the MOS transistor M21 and a gate to which the first transmission signal at the first output node N1 is applied.

The MOS transistor M23 has a first current terminal connected to a second current terminal of the MOS transistor M22, a second current terminal connected to the ground voltage GND, and a gate to which the enable signal IE is applied.

The MOS transistor M24 has a first current terminal connected to a common terminal of the MOS transistors M21 and M22, a second current terminal connected to the third supply voltage VDDP, and a gate to which the second transmission signal at the second output node N2 is applied.

The MOS transistors M17-M20 may be PMOS transistors, and the bulk regions of each of the MOS transistors M17-M20 may be biased to the third supply voltage VDDP.

The MOS transistors M21-M24 may be NMOS transistors, and the bulk regions of each of the MOS transistors M21-M24 may be biased to the ground voltage GND.

Figure 6:
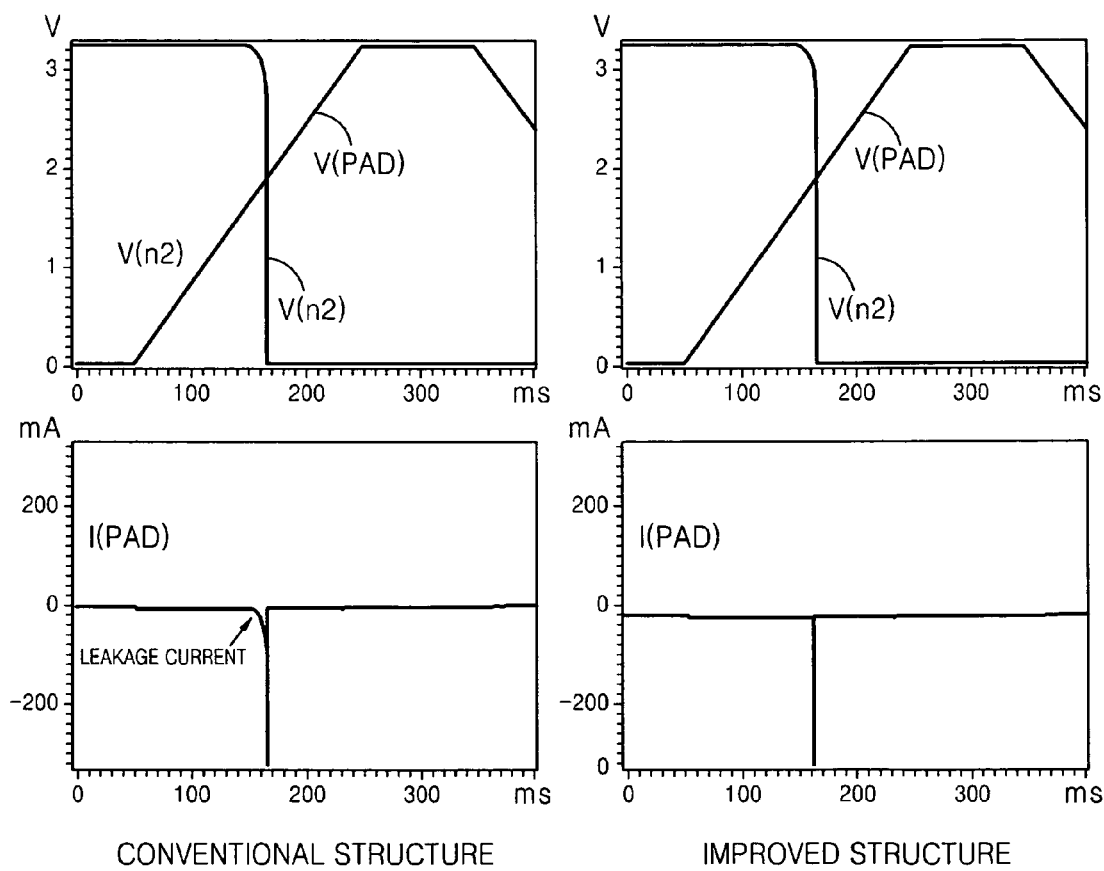
FIG. 6 shows waveforms related to a second transmission signal corresponding to an input signal applied to an input circuit according to some embodiments of the present invention.

FIG. 6 shows a waveform of the second transmission signal generated in response to an input signal. Referring to FIG. 6, the left-hand side waveforms illustrate operations of a conventional input circuit configured to operate using a range of supply voltages and the right-hand side waveforms illustrate operations of an input circuit configured to operate using a range of supply voltages according to some embodiments of the present invention.

As shown on the left-hand side of FIG. 6, in a conventional input circuit configured to operate using a range of supply voltages, when a voltage V(PAD) of the input pad is increased, a leakage current I(PAD) may flow from the input pad just before and/or just after the transition of the voltage V(n2) of the second transmission signal from a high level to a low level.

As shown on the right-hand side of FIG. 6, in an input circuit configured to operate using a range of supply voltages according to some embodiments of the present invention, when a voltage V(PAD) of the input pad is increased, there may be no significant current leakage in a current flowing from the input pad when the voltage V(n2) of the second transmission signal is changed from a high level to a low level.

As described above, an input circuit configured to operate using a range of supply voltages may reduce and/or prevent leakage current that may occur during a transition of a voltage applied to an input pad, as the operating voltage of a system or a threshold voltage of MOS transistors used in the circuit is lowered.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An input circuit, comprising:
  an input signal transmission circuit configured to output a first transmission signal at a first output node in response to an input signal at an input node; and
  a Schmitt trigger inverter having an input connected to the first output node and an output connected to a second output node and configured to output a second transmission signal at the second output node in response to the input signal and the first transmission signal;
  wherein the input signal transmission circuit comprises:
  a voltage drop element having a first terminal connected to the input node and having a second terminal and being configured to provide a voltage drop between the first terminal thereof and the second terminal thereof;
  a first MOS transistor having a first current terminal connected to the second terminal of the voltage drop element and a gate to which a first supply voltage is applied;
  a second MOS transistor having a first current terminal connected to a second current terminal of the first MOS transistor at a common node and a gate to which a second supply voltage is applied;
  a third MOS transistor having a first current terminal connected to a second current terminal of the second MOS transistor, a second current terminal connected to a ground voltage and a gate to which the second transmission signal is applied; and
  a switch having an input connected directly to the input node and an output connected to the first output node and configured to transmit the input signal to the first output node in response to a voltage at a common terminal of the first and second MOS transistors and a third supply voltage that is different from the first supply voltage.

2. The input circuit of claim 1, wherein the voltage drop element comprises a fourth MOS transistor having a first current terminal connected to the input node, a second current terminal coupled to the first current terminal of the first MOS transistor, and a gate connected to the first current terminal of the first MOS transistor.

3. The input circuit of claim 1, wherein the voltage drop element comprises a diode having an anode connected to the input node and a cathode connected to the first current terminal of the first MOS transistor.

4. The input circuit of claim 1, wherein the switch comprises:
  a fifth MOS transistor having a first current terminal connected to the input node, a second current terminal connected to the first output node, and a gate to which the third supply voltage is applied; and
  a sixth MOS transistor having a first current terminal connected to the first current terminal of the fifth MOS transistor, a second current terminal connected to the second current terminal of the fifth MOS transistor, and a gate connected to the common node of the first and second MOS transistors.

5. The input circuit of claim 4, wherein the second MOS transistor, the third MOS transistor and the fifth MOS transistor are NMOS transistors, and the first MOS transistor and the sixth MOS transistor are PMOS transistors.

6. The input circuit of claim 5, wherein a bulk region of each of the first MOS transistor and the sixth MOS transistor is allowed to float or is biased at a predetermined voltage.

7. The input circuit of claim 6, wherein the predetermined voltage is the highest supply voltage used in a system in which the input circuit is used.

8. The input circuit of claim 5, wherein a voltage level of the second supply voltage and a voltage level of the third supply voltage are both higher than a voltage level of the first supply voltage.

9. The input circuit of claim 1, wherein the Schmitt trigger inverter comprises:
  a seventh MOS transistor having a first current terminal connected to the third supply voltage and a gate to which the input signal is applied;
  an eighth MOS transistor having a first current terminal connected to a second current terminal of the seventh MOS transistor and a gate to which the first transmission signal is applied;
  a ninth MOS transistor having a first current terminal connected to a second current terminal of the eighth MOS transistor, a second current terminal through which the second transmission signal is output, and a gate to which the first transmission signal is applied;

a tenth MOS transistor having a first current terminal connected to the commonly connected terminals of the eighth and ninth MOS transistors, a second current terminal connected to the ground voltage, and a gate to which the second transmission signal is applied;

an eleventh MOS transistor having a first current terminal through which the second transmission signal is output and a gate to which the first transmission signal is applied;

a twelfth MOS transistor having a first current terminal connected to a second current terminal of the eleventh MOS transistor and a gate to which the first transmission signal is applied;

a thirteenth MOS transistor having a first current terminal connected to a second current terminal of the twelfth MOS transistor, a second current terminal connected to the ground voltage, and a gate to which the input signal is applied; and a fourteenth MOS transistor having a first current terminal connected to the commonly connected terminals of the eleventh and twelfth MOS transistors, a second current terminal connected to the third supply voltage, and a gate to which the second transmission signal is applied.

10. The input circuit of claim 9, wherein the seventh, eighth, ninth and tenth MOS transistors are PMOS transistors and the eleventh, twelfth, thirteenth and fourteenth MOS transistors are NMOS transistors.

11. The input circuit of claim 10, wherein a bulk region of each of the seventh, eighth, ninth and tenth MOS transistors is commonly biased to the second supply voltage and a bulk of each of the eleventh, twelfth, thirteenth and fourteenth MOS transistors is commonly biased to the ground voltage.

12. The input circuit of claim 1, further comprising:
an input pad; and
an electrostatic discharge (ESD) protection circuit disposed between the input pad and the input signal transmission circuit;
wherein the ESD protection circuit discharges electrostatic charge applied through the input pad.

13. The input circuit of claim 1, further comprising: an inverter configured to buffer the second transmission signal output by the Schmitt trigger inverter.

14. An input circuit, comprising:
an input signal transmission circuit including an input node, a first output node and a feedback control node, wherein the input signal transmission circuit is configured to output a first transmission signal at the first output node in response to an input signal at the input node and a feedback control signal at the feedback control node;
an enable block configured to generate the feedback control signal in response to an externally applied enable signal; and
a Schmitt trigger inverter configured to output a second transmission signal at a second output node in response to the first transmission signal and the enable signal.

15. The input circuit of claim 14, wherein the input signal transmission circuit comprises:
a voltage drop element having a first terminal connected to the input node and having a second terminal;
a first MOS transistor having a first current terminal connected to the second terminal of the voltage drop element and a gate to which a first supply voltage is applied;

a second MOS transistor having a first current terminal connected to a second current terminal of the first MOS transistor at a common node and a gate to which a second supply voltage is applied;

a third MOS transistor having a first current terminal connected to a second current terminal of the second MOS transistor, a second current terminal connected to a ground voltage, and a gate connected to the feedback control node; and a switch having a first terminal connected directly to the input node and a second terminal connected to the first output node and configured to transmit the input signal to the first output node in response to a voltage at the common terminal of the first and second MOS transistors and a third supply voltage.

16. The input circuit of claim 15, wherein the voltage drop element comprises a fourth MOS transistor having a first current terminal connected to the input node, a second current terminal coupled to the first current terminal of the first MOS transistor, and a gate connected to the first current terminal of the first MOS transistor.

17. The input circuit of claim 15, wherein the voltage drop element comprises a diode having an anode connected to the input node and a cathode connected to the first current terminal of the first MOS transistor.

18. The input circuit of claim 15, wherein the first switch comprises:
a fifth MOS transistor having a first current terminal connected to the input node, a second current terminal connected to the first output node, and a gate to which the third supply voltage is applied; and
a sixth MOS transistor having a first current terminal connected to the first current terminal of the fifth MOS transistor, a second current terminal to connected the second current terminal of the fifth MOS transistor, and a gate connected to the common node of the first and second MOS transistors.

19. The input circuit of claim 18, wherein the second MOS transistor, the third MOS transistor, and the fifth MOS transistor are NMOS transistors, and the first MOS transistor and the sixth MOS transistor are PMOS transistors.

20. The input circuit of claim 19, wherein a bulk region of each of the first MOS transistor and the sixth MOS transistor is floated or is biased at a predetermined voltage.

21. The input circuit of claim 20, wherein the predetermined voltage is the highest supply voltage used in a system in which the input circuit is used.

22. The input circuit of claim 18, wherein a voltage level of the second supply voltage and a voltage level of the third supply voltage are both higher than a voltage level of the first supply voltage.

23. The input circuit of claim 14, wherein the Schmitt trigger inverter comprises:
a seventh MOS transistor having a first current terminal connected to the third supply voltage and a gate to which the input signal is applied;
an eighth MOS transistor having a first current terminal connected to a second current terminal of the seventh MOS transistor and a gate to which the first transmission signal is applied;
a ninth MOS transistor having a first current terminal connected to a second current terminal of the eighth MOS transistor, a second current terminal through which the second transmission signal is output, and a gate to which the first transmission signal is applied;
a tenth MOS transistor having a first current terminal connected to the commonly connected terminals of the eighth and ninth MOS transistors, a second current terminal connected to the ground voltage, and a gate to which the second transmission signal is applied;

an eleventh MOS transistor having a first current terminal which is connected to the second current terminal of the ninth MOS transistor and through which the second transmission signal is output, and a gate to which the first transmission signal is applied;

a twelfth MOS transistor having a first current terminal connected to a second current terminal of the eleventh MOS transistor and a gate to which the first transmission signal is applied;

a thirteenth MOS transistor having a first current terminal connected to a second current terminal of the twelfth MOS transistor, a second current terminal to which the ground voltage is applied, and a gate to which the enable signal is applied; and a fourteenth MOS transistor having a first current terminal connected to a common terminal of the eleventh and twelfth MOS transistors, a second current terminal to which the third supply voltage is applied, and a gate to which the second transmission terminal signal is applied.

24. The input circuit of claim 23, wherein the seventh, eight, ninth and tenth MOS transistors are PMOS transistors and the eleventh, twelfth, thirteenth and fourteenth MOS transistors are NMOS transistors.

25. The input circuit of claim 24, wherein a bulk region of each of the seventh, eight, ninth and tenth MOS transistors is biased to the second supply voltage and a bulk region of each of the eleventh, twelfth, thirteenth and fourteenth MOS transistors is commonly biased to the ground voltage.

26. The input circuit of claim 14, wherein the enable block comprises:

a pull-up unit having a first current terminal connected to the second output node and a second current terminal connected to the third supply voltage and configured to apply the third supply voltage to the second output node in response to the enable signal;

an inverter configured to invert the enable signal to thereby provide an inverted enable signal; and a switch having a first terminal connected to the second output node and a second terminal connected to the feedback control node and configured to output the feedback control signal at the feedback control node by switching the second transmission signal at the second output node in response to the enable signal and the inverted enable signal.

27. The input circuit of claim 26, wherein the switch comprises:

a first MOS transistor having first and second terminals and having a gate to which the enable signal is applied and that is configured to receive the second transmission signal through its first terminal and output the feedback control signal through its second terminal; and an second MOS transistor which has a first current terminal connected to the first current terminal of the first MOS transistor, a second current terminal connected to the second current terminal of the first MOS transistor, and a gate to which the inverted enable signal is applied.

28. The input circuit of claim 26, wherein the pull-up unit comprises a fifteenth MOS transistor having a first current terminal connected to the second transmission signal, a second current terminal connected to the third supply voltage, and a gate to which the enable signal is applied.

29. The input circuit of claim 26, wherein the enable block further comprises a pull-down unit which has a first current terminal connected to the feedback control signal and a second current terminal connected to the ground voltage and a control terminal connected to an output of the inverter, and which is configured to pull down a voltage level of the feedback control signal to the ground voltage in response to the inverted enable signal.

30. The input circuit of claim 29, wherein the pull-down unit comprises a sixteenth MOS transistor having a first current terminal connected to the feedback control signal, a second current terminal connected to the ground voltage, and a gate to which the inverted enable signal is applied.

31. The input circuit of claim 14, further comprising:

an input pad; and an ESD protection circuit disposed between the input pad and the input signal transmission circuit;

wherein the ESD protection circuit discharges electrostatic charge applied through the input pad.

32. The input circuit of claim 14, further comprising:

an inverter configured to buffer the second transmission signal output by the Schmitt trigger inverter.

* * * * *

UNITED STATES PATENT AND TRADEMARK OFFICE
CERTIFICATE OF CORRECTION

PATENT NO. : 7,388,410 B2  
APPLICATION NO. : 11/350711  
DATED : June 17, 2008  
INVENTOR(S) : Kim et al.

Page 1 of 1

It is certified that error appears in the above-identified patent and that said Letters Patent is hereby corrected as shown below:

On Title Page:
Primary Examiner: Please correct to read -- Charles D. Garber --

Column 16, Claim 18, Line 34: Please correct "terminal to connected"
To read -- terminal connected to --

Signed and Sealed this

Twenty-sixth Day of August, 2008

JON W. DUDAS
*Director of the United States Patent and Trademark Office*